United States Patent [19]
DiIorio et al.

[11] Patent Number: 5,806,318
[45] Date of Patent: Sep. 15, 1998

[54] COOLING USING A CRYOGENIC LIQUID AND A CONTACTING GAS

[75] Inventors: Mark S. DiIorio; Kai-Yueh Yang; Shozo Yoshizumi, all of San Diego, Calif.

[73] Assignee: Biomagnetic Technologies, Inc., San Diego, Calif.

[21] Appl. No.: 777,111

[22] Filed: Dec. 30, 1996

[51] Int. Cl.$^6$ .................................................. F17C 11/00
[52] U.S. Cl. ........................... 62/46.1; 62/51.1; 220/88.3
[58] Field of Search .................................. 62/46.1, 51.1; 220/88.3

[56] References Cited

U.S. PATENT DOCUMENTS

| | | | |
|---|---|---|---|
| 3,710,549 | 1/1973 | Nichols et al. | 220/88.3 |
| 4,088,193 | 5/1978 | Colgate | 220/88.3 |
| 4,593,537 | 6/1986 | Kimura et al. | 220/88.3 |
| 4,970,868 | 11/1990 | Grebe et al. | 62/51.1 |
| 5,441,658 | 8/1995 | Boyarsky et al. | 252/67 |

FOREIGN PATENT DOCUMENTS 1 336 892   11/1973   United Kingdom .

OTHER PUBLICATIONS

F.F. Kharekhorin, "The Phase Relations in systems of Liquefied Gases—The Binary Mixture Nitrogen–Helium", *J. Technical Physics USSR*, vol. 10, No. 18, pp. 1533–1540 (1940). (Translation).

George Buzyna et al., "Vapor–Liquid Equilibrium in the Helium–Nitrogen System", *Chem.Eng.Progr.Symposium Series*, No. 59, pp. 101–111 (1963).

Robert J. Burch, "Low Temperature Phase Equilibria of the Gas–Liquid System Helium–Neon–Nitrogen," *Engineering Data*, vol. 9, No. 1, pp. 19–24 (1964).

W.B. Streett, Liquid–Vapour Equilibrium in the System Neon–Nitrogen, *Cryogenics*, pp. 27–33 (1965).

William B. Streett, Gas–Liquid and Fluid–Fluid Phase Separation in the System Helium–Nitrogen Near the Critical Temperature of Nitrogen, *Chem.Eng.Progr.Symposium Series*, No. 63, pp. 37–42 (1967).

W.B. Streett, "Density and Phase Equilibria in the System Neon–Nitrogen", *Cryogenics*, pp. 88–93, Apr. 1968.

E.I. Leyarovski et al., "Continuous process for the separation of Ne–He mixtures at 80K", *Cryogenics*, vol. 28, pp. 599–604 (1988).

Robert L. Paugh, "New class of microminiature Joule–Thompson refrigerator and vacuum package", *Cryogenics*, vol. 30, pp. 1079–1083 (1990).

*Primary Examiner*—Ronald C. Capossela
*Attorney, Agent, or Firm*—Gregory Garmong

[57] ABSTRACT

A cooling apparatus includes a dewar and a quantity of liquid nitrogen within the container. Gaseous helium is contacted to the liquid nitrogen, either by contacting its top surface or by being bubbled through the liquid nitrogen. The temperature of the cryogenic liquid is lowered by the contact of the gas.

20 Claims, 5 Drawing Sheets

COOLING USING A CRYOGENIC LIQUID AND A CONTACTING GAS

BACKGROUND OF THE INVENTION

This invention relates to cryogenic cooling, and, more particularly, to reducing the temperature of a cryogenic liquid by contacting it with a gas.

A large number of devices, particularly electronic devices, are operated at sub-ambient temperatures. The reduced temperature is used either because the device will not operate at higher temperatures or because improved operation is achieved at lower temperature, or for both reasons. In an example, superconducting magnetic field sensors operate only at temperatures below the superconducting critical temperatures of the materials of construction. It is often desirable to reduce the operating temperature even further to achieve an improved signal-to-noise ratio, because of the reduced thermal noise experienced at lower temperatures.

It is a common practice to cool such devices using as a heat sink a reservoir of a cryogenic liquid having a low boiling temperature. The device may be either immersed in the cryogenic liquid or in thermal contact with the cryogenic liquid through a good conductor of heat. The heat in the device is conducted to the cryogenic reservoir and absorbed by the cryogenic liquid.

The discovery of high-temperature superconductors, those having superconducting critical temperatures of about the liquid-nitrogen boiling temperature or above, promises a major improvement in some areas of technology that utilize superconducting devices. In a field of particular interest to the inventors, a superconducting magnetic field sensor, termed a superconducting quantum interference device or SQUID, made of high-temperature superconductors is favorably operated at about the liquid-nitrogen boiling temperature (77K) or below for the high-temperature superconductors now available, rather than at the liquid-helium boiling temperature (4.2K) typically used for conventional low-temperature superconductors. The ability to operate at such higher temperatures allows the use of relatively inexpensive liquid-nitrogen coolant and also a significant reduction in the required insulation.

A magnetic field sensor using an available high-temperature superconductor having a superconducting critical temperature of about or just above (e.g., 77–87K) the liquid-nitrogen boiling temperature may be operated using liquid nitrogen as the heat sink. On the other hand, a high-temperature superconductor that has a superconducting critical temperature just below the liquid-nitrogen boiling temperature cannot be readily operated using liquid nitrogen as the coolant. In either case, however, it would be desirable to reduce the boiling temperature of the liquid nitrogen by a relatively small amount, up to about 10K or so, to achieve reduced noise in the former case and to achieve basic operability of the device in the latter case.

The boiling temperature of the liquid nitrogen is a physical constant of about 77K at ambient pressure. Its boiling temperature may be reduced somewhat by applying a vacuum to the liquid nitrogen, but provision of a vacuum system and the associated pumping equipment is cumbersome, costly, and can produce electromagnetic noise that may adversely affect the operation of the device. Care must be taken while vacuum pumping on liquid nitrogen to avoid solidifying the nitrogen, which can cause damage to the fragile electronic components. The use of a vacuum system can also reduce the availability of certain system packaging operations. For example, it is more difficult or impossible to use a thin, flexible-wall container if it is necessary to evacuate the interior of the container. Mechanical cryocoolers (refrigerators) can also be employed for cooling rather than a cryogenic liquid reservoir, but the cryocooler/refrigerator is expensive and is a source of mechanical and electrical noise.

The inventors have recognized a need for an improved approach to the cooling of superconducting devices operating with a cryogenic coolant by a relatively small amount, on the order of a few degrees, without using vacuum pumping or a cryocooler/refrigerator. Such a capability would have wide applicability, both for superconducting devices and also for many other applications including some types of radiation sensors and computer chip circuits. The present invention fulfills this need, and further provides related advantages.

SUMMARY OF THE INVENTION

The present invention provides an apparatus and method for achieving increased cooling of a cryogenic liquid. The approach of the invention utilizes a reservoir of a cryogenic liquid as a heat sink, but reduces the boiling temperature of the cryogenic liquid to less than its natural boiling temperature. No vacuum pump or mechanical cryocooler is necessary, although the present approach can optionally be used in conjunction with a vacuum-pumped or mechanically cooled cryogenic reservoir. The present invention allows devices to be conveniently cooled to a temperature on the order of up to about 10K or more below the boiling temperature of liquid nitrogen, the cryogenic liquid of most interest. In the preferred case, the ambient-pressure boiling temperature of liquid nitrogen, and thence its effective temperature as a cryogenic coolant, is readily reduced from 77K to about 68–71K, with little additional capital or operating cost. This relatively small reduction in temperature may reduce the noise in a SQUID made of a material having a superconducting critical temperature of about 77K by a substantial amount. For a SQUID made of high temperature superconductors having a superconducting critical temperature a few degrees above 77K, the noise reduction may be a factor of 100 or more.

In accordance with the invention, an apparatus comprises a container, a cryogenic liquid within the container, and a gas contacting the cryogenic liquid. The gas is of a different chemical composition than the cryogenic liquid and is soluble in the cryogenic liquid. The contacting of the gas to the cryogenic liquid lowers the temperature of the cryogenic liquid, so that the temperature of a device in thermal contact with the cryogenic liquid, and using the cryogenic liquid as a thermal sink, is also lowered. In a most preferred case, the cryogenic liquid is liquid nitrogen, and the gas is helium, but the invention is not so limited.

The gas is contacted to the cryogenic liquid in any operable manner, and two approaches are presently preferred. In one, the gas is bubbled through the cryogenic liquid. The gas introduction apparatus includes a tube extending below the top surface of the cryogenic liquid and a compressed source of the gas. In the other, the gas is contacted to the top surface of the cryogenic liquid, typically by providing a cover to the container and filling the space between the top surface of the cryogenic liquid and the cover with the gas.

The reduced-temperature cryogenic liquid may be used in any desired manner. In an application of particular interest, a device is placed into thermal contact with the cryogenic fluid, either by immersion or through a heat conductor. The device may be of any type that operates at sub-ambient temperature. The inventors are particularly concerned with the cooling of magnetic sensors and SQUIDs, but the invention is not limited to that application.

Testing has shown that the contacting of helium to liquid nitrogen quickly reduces the ambient-pressure boiling temperature of the liquid nitrogen from about 77K to about 68–71K. The operating temperature of the device in thermal contact with the liquid nitrogen is similarly reduced. The reduced temperature is maintained for an extended period of time. This relatively small reduction in temperature reduces the signal-to-noise ratio of the sensor by a factor of about 2–100, with very little increase in operating costs.

The present approach thus provides a low-cost, readily implemented technique for reducing the temperature of a cryogenic reservoir. Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

DETAILED DESCRIPTION OF THE INVENTION

Figure 1:
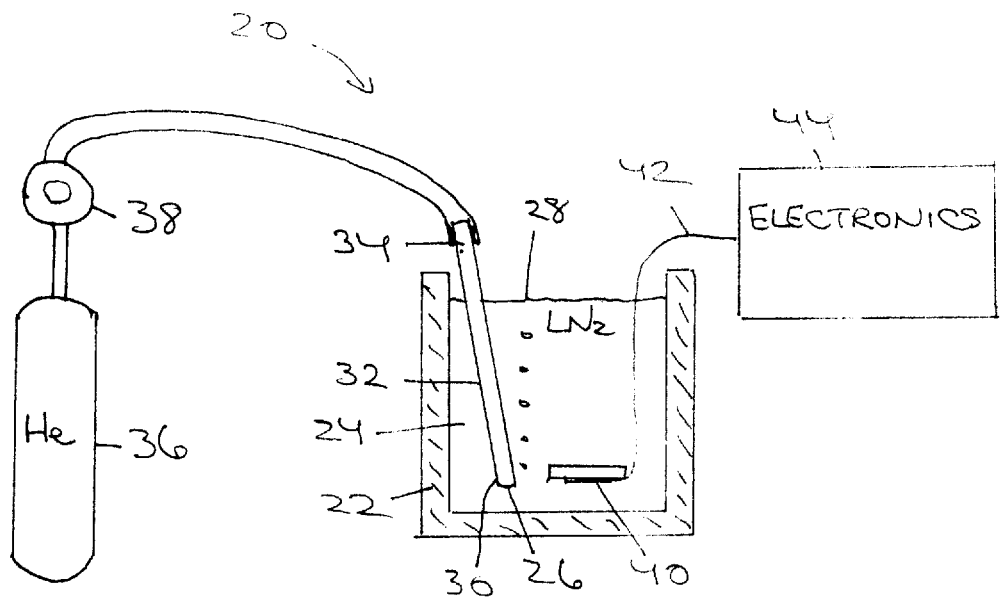
FIG. 1 is a schematic sectional view of a first embodiment of the invention.

FIG. 1 illustrates an apparatus 20 that utilizes the invention. The apparatus includes a container 22 and a quantity of a cryogenic liquid 24 within the container 22. The container 22 is preferably insulated to minimize the heat loss from the cryogenic liquid 24, as in the form of a dewar vessel. The cryogenic liquid acts as a thermal reservoir to absorb heat.

The apparatus 20 further includes a source 26 of a gas located below a top surface 28 of the cryogenic liquid 24. In this case, the source 26 is a bottom end 30 of a tube 32 that extends downwardly below the top surface 28. A top end 34 of the tube 32 is supplied gas from a compressed gas source 36 through an adjustable pressure/flow regulator 38. Optionally, the cryogenic liquid may be stirred to increase the contact and dispersion of the introduced gas into the cryogenic liquid. Preferably but not necessarily, a device 40 is in thermal contact with the cryogenic liquid 24. The device 40 shown in FIG. 1 is immersed in the cryogenic liquid 24 and connected by an electrical lead 42 to external electronics 44. For the temperature measurements discussed in relation to FIGS. 6–9, the device 40 was a silicon diode thermometer. In other applications, the device 40 is any operable type of device requiring cooling, such as a magnetic field sensor, a superconducting quantum interference device, an energy sensor, a radiation sensor, an electronic circuit, etc.

The cryogenic liquid 24 is a liquefied gas, most preferably liquid nitrogen (termed $LN_2$). Other cryogenic liquids such as liquid oxygen, liquid neon, liquid hydrogen, liquid helium, liquid $CH_4$, liquid $C_2H_6$, or liquid $C_3H_8$ can also be used. The gas introduced from the source 26 is a pure gas or a mixture of gases. It has a chemical composition different from that of the cryogenic liquid, and it is soluble in the cryogenic liquid. Preferably, the gas dissolves endothermically into the cryogenic liquid. Such gaseous components may include, for example, helium, hydrogen, neon, nitrogen, oxygen, krypton, tetrafluoromethane, methane, $C_2H_6$, or $C_3H_8$.

Each cryogenic liquid has a characteristic boiling temperature at a selected overpressure, and the specific cryogenic liquid is selected in conjunction with application requirements such as the temperature required and the cost of the cryogenic liquid. Liquid nitrogen is particularly preferred, because it has an ambientpressure boiling temperature of 77K, which is sufficiently low for many applications, because it has a high heat of vaporization, because it is inexpensive, and because it is not reactive (e.g., flammable) in a wide variety of applications. In the preferred case of liquid nitrogen as the cryogenic liquid, the preferred gas contacted to the liquid nitrogen is helium.

Figure 2:
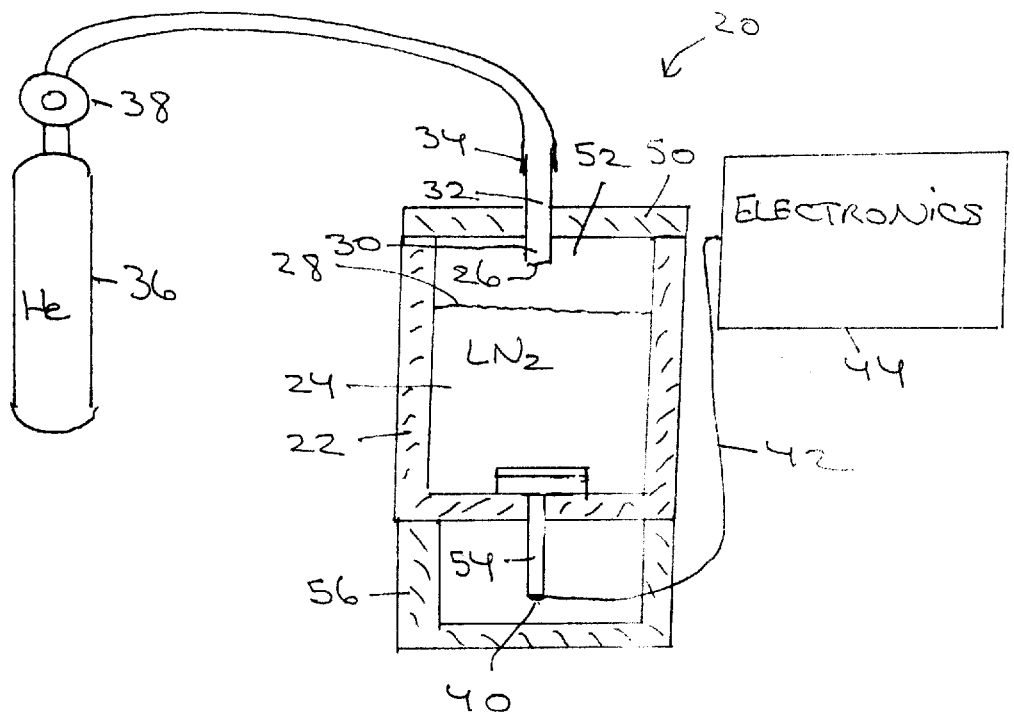
FIG. 2 is a schematic sectional view of a second embodiment of the invention.

FIG. 2 illustrates a second embodiment of the apparatus 20. Many of the elements discussed in relation to FIG. 1 are the same in this embodiment. Such common elements have been assigned the same numerical identifiers as discussed above, and that discussion is incorporated here. In this embodiment, the container 22 has a cover 50. The source 26 of the gas is the bottom end 30 of the tube 32, but in this case the tube 32 does not extend below the top surface 28 of the cryogenic liquid 24. Instead, the bottom end 30 of the tube 32 is above the top surface 28, in a gas space 52 between the cover 50 and the top surface 28.

The embodiment of FIG. 2 also illustrates that the device 40 need not be immersed in the cryogenic liquid 24. In this case, a thermal conductor 54 extends between the interior of the container 22, contacting the cryogenic liquid, and the exterior of the container 22. The device 40 is mounted in a vacuum space on that portion of the thermal conductor 54 which is outside the container 22. An insulated vacuum housing 56 preferably surrounds the device 40 and that portion of the thermal conductor 54 which extends outside the container 22. Rather than removing heat by immersion contact as in FIG. 1, the embodiment of FIG. 2 conducts heat from the device 40 to the cryogenic liquid thermal reservoir. The thermal conductor approach of FIG. 2 can be used in conjunction with the gas bubbling approach of FIG. 1 or the device-immersion approach of FIG. 1 can be used in conjunction with the gas space approach of FIG. 2, if desired.

Figure 3:
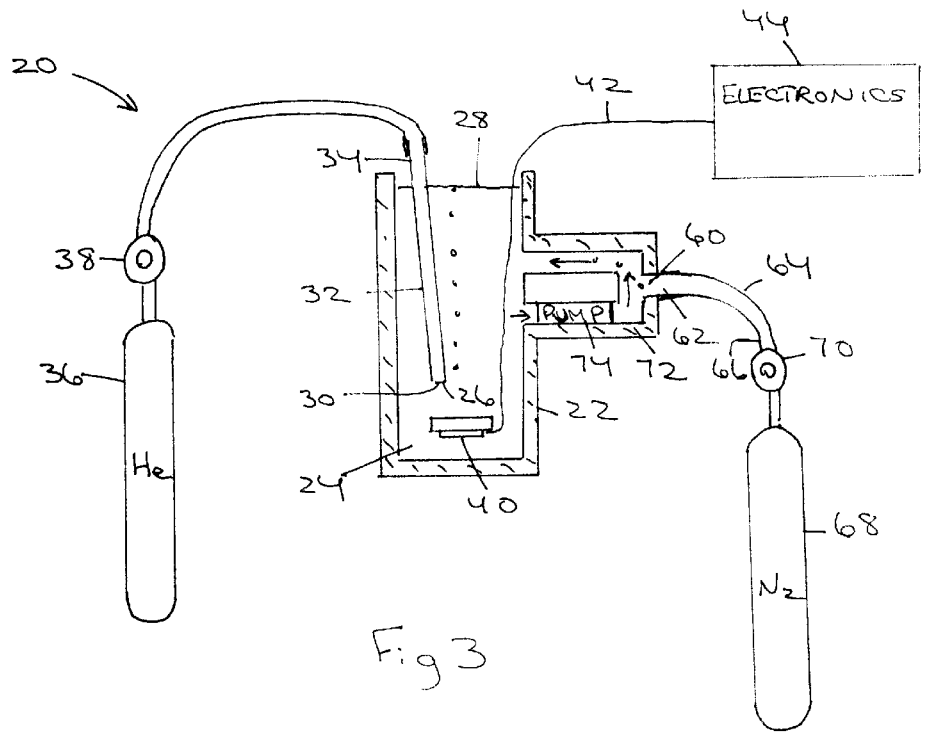
FIG. 3 is a schematic sectional view of a third embodiment of the invention.
Figure 4:
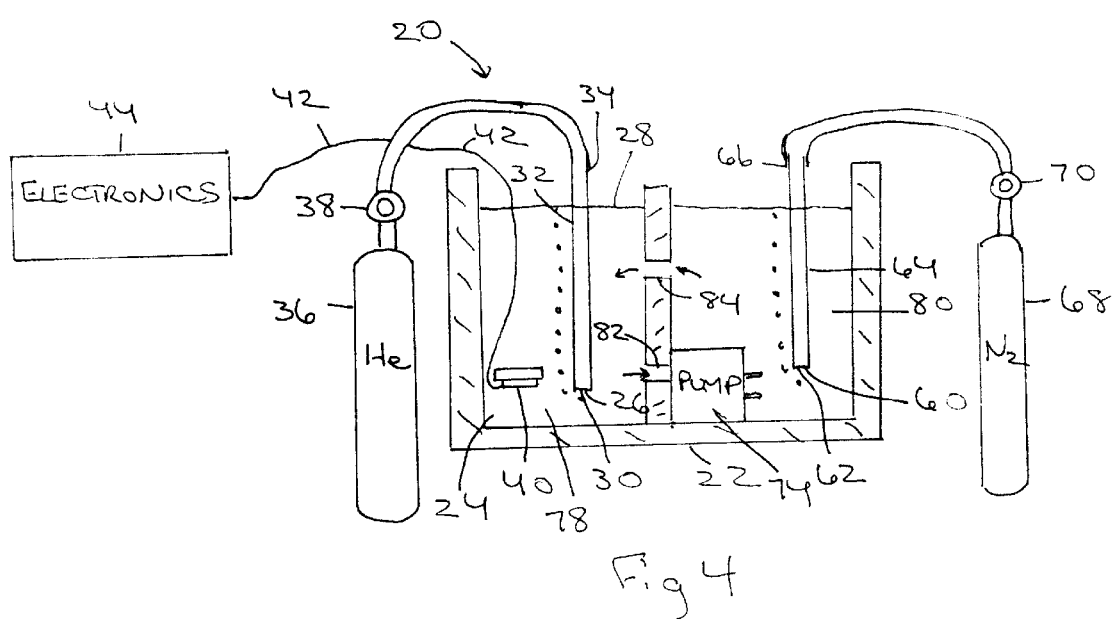
FIG. 4 is a schematic sectional view of a fourth embodiment of the invention.

FIGS. 3 and 4 present embodiments that incorporate some other optional features. The embodiments of FIGS. 3 and 4 are similar to that of FIG. 1, in that the source 26 is the bottom end 30 of the tube 32 immersed below the top surface 28 of the cryogenic liquid 24. The features already presented in relation to FIG. 1 are given the same numeral designations in FIGS. 3 and 4, and the discussion is incorporated here.

In the embodiment of FIG. 3, a second source 60 of a second gas is provided. Most conveniently, the second gas is the same gas which is produced when the cryogenic liquid boils. That is, where the cryogenic liquid is the preferred liquid nitrogen, the second gas is gaseous nitrogen. The second source 60 is an end 62 of a second tube 64, whose opposite end 66 receives a flow of the second gas from a compressed second gas source 68 through a second adjustable pressure/flow regulator 70. The end 62 is immersed below the top surface 28 of the cryogenic liquid 24.

The second gas is conveniently introduced into the cryogenic liquid by circulating the cryogenic liquid through a regeneration loop 72 using a pump 74. The second source 60 is located in the regeneration loop 72, so that the second gas is introduced as the cryogenic liquid circulates past the second source 60.

In another embodiment shown in FIG. 4, a barrier 76 divides the container 22 into two parts. The source 26 of the first gas is in a first side 78 of the container 22, and the source 60 of the second gas is in a second side 80 of the container 22. The pump 74 draws cryogenic liquid from the first side 78 to the second side 80 through a first aperture 82 in the barrier 76. After regeneration, cryogenic liquid flows from the second side 80 back into the first side 78 by hydraulic pressure, through a second aperture 84 in the barrier 76.

The effect of contacting the second gas to the cryogenic liquid is to reverse the boiling-point depression effects of the first gas. The first gas causes the boiling point of the cryogenic liquid to be reduced. The second gas reverses this effect by drawing the first gas out of solution, and causes the boiling point of the cryogenic liquid to rise back toward its ambient-pressure value. In a typical operation of the apparatus 20, the first source 26 is operated by opening the regulator 38 to permit gas to flow from the compressed gas source 36. The first gas thereafter causes a reduction of the temperature of the cryogenic liquid in the container 22. At this time, the pump 74 and the second gas source 60 are not operated. At a later time, when it is desired to raise the temperature of the cryogenic liquid, the regulator 38 is closed, discontinuing operation of the source 26. The pump 74 is started, causing a circulation of the cryogenic liquid past the second source 60. The regulator 70 is opened, allowing the second gas to flow into the cryogenic liquid from the second gas source 68.

The second gas may be introduced to raise the temperature of the cryogenic liquid as an end in itself. In that event, there need not be a regeneration loop 72 or a barrier 76. The second gas may also be introduced in order to permit long-term maintenance of the boiling-point depression effects of the first gas. It is observed that, when the first gas is introduced into the cryogenic liquid, the temperature of the cryogenic liquid is reduced for an extended period of time. However, after very long times the temperature may tend to rise even when the first gas continues to be introduced. Contacting the second gas to the cryogenic liquid drives the first gas out of solution, raises the temperature of the cryogenic liquid somewhat, and regenerates the cryogenic liquid so that subsequent re-contacting of the first gas to the cryogenic liquid may re-establish the reduced temperature.

The various features of FIGS. 1–4 can be used in any operable combination.

Figure 5:
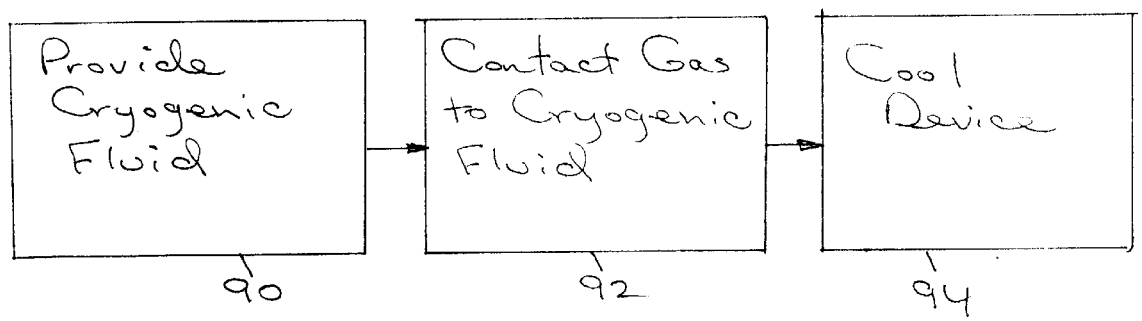
FIG. 5 is a block flow diagram of a preferred form of practicing the method of the invention.
Figure 6:
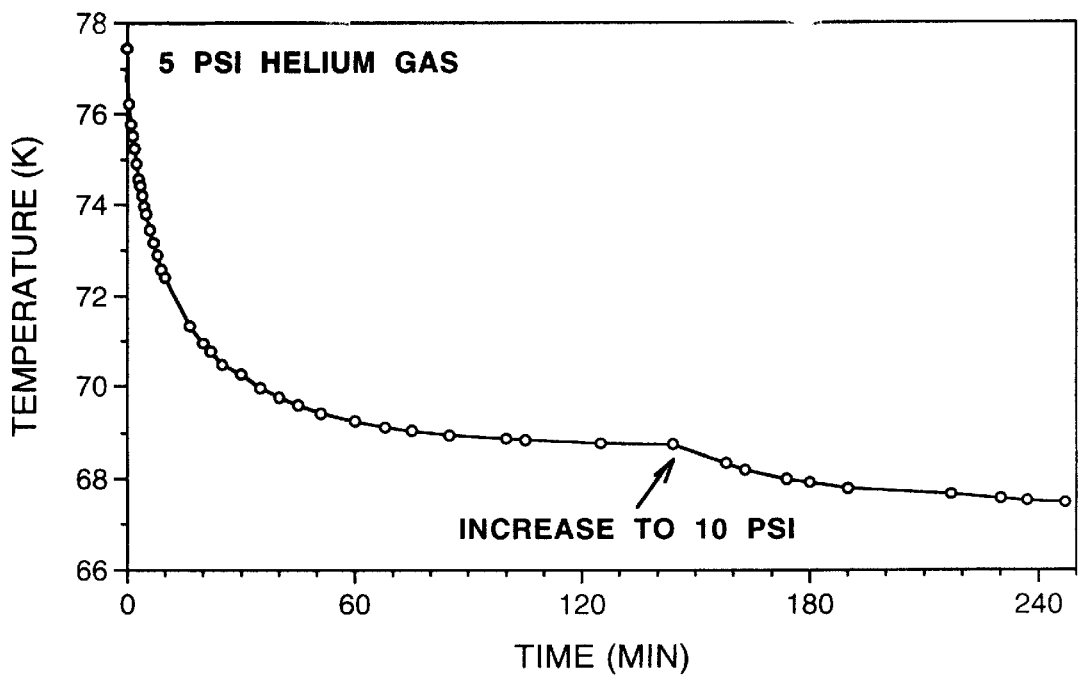
FIG. 6 is a graph of the temperature of liquid nitrogen as a function of time as helium gas is flowed into the liquid nitrogen.
Figure 7:
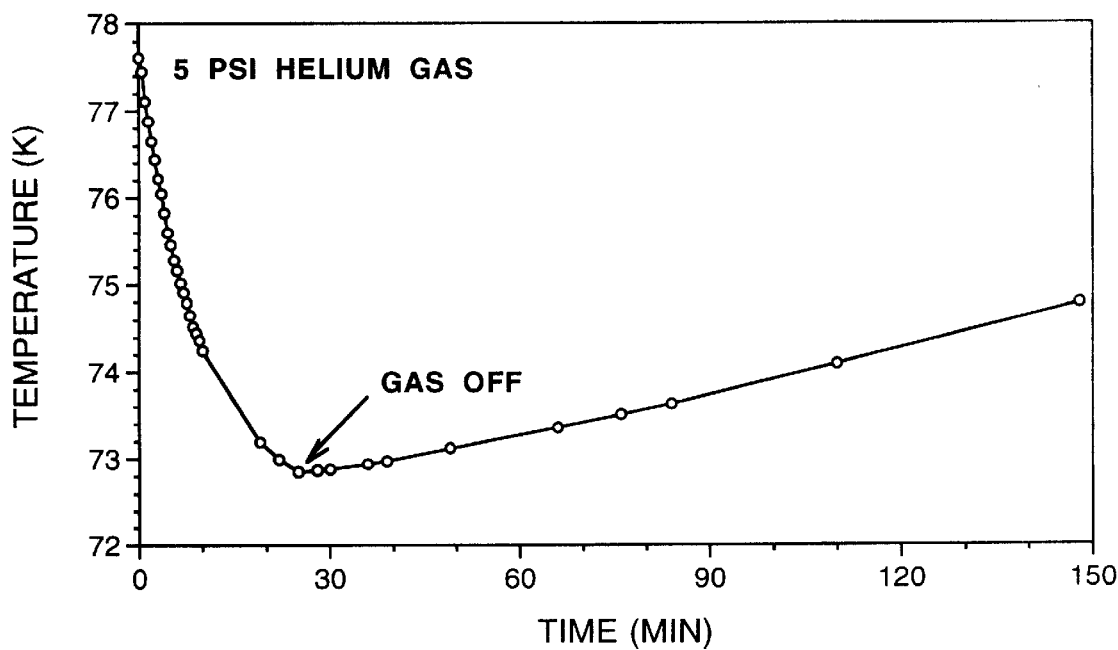
FIG. 7 is a graph of the temperature of liquid nitrogen when helium gas is introduced into the space above the liquid nitrogen, and later discontinued.

A preferred method for practicing the approach of the invention is illustrated in FIG. 5. The prior description of cryogenic liquids, gases, and other features of the invention is incorporated. The cryogenic liquid is provided, numeral 90. The gas which has a different chemical composition than the cryogenic liquid and is soluble in the cryogenic liquid is contacted to the cryogenic liquid, numeral 92. Optionally, a device may be provided in thermal contact with the cryogenic liquid and cooled, numeral 94.

The boiling-point depression effects of the present approach were confirmed using apparatus of the type illustrated in FIGS. 1 and 2, with liquid nitrogen as the cryogenic liquid, helium as the contacting gas, and with a silicon diode thermometer as the device being cooled. The bubbling approach of FIG. 1 was used to develop the temperature-time data of FIG. 6. Helium at a pressure of 5 psi (pounds per square inch) was bubbled through the liquid nitrogen, and the temperature as a function of time is shown as the first part of FIG. 5. The temperature decreases from 77K to a saturation temperature of about 69K in about 1 hour and thereafter does not decrease further. After about 2½ hours, the pressure of the helium gas was increased to 10 psi to increase the flow rate of the helium gas, and the temperature of the liquid nitrogen decreased further to a saturation value of about 68K. The container in which these studies were conducted was open, so that the change in pressure reflects a change in flow rate but not a change in the applied overpressure to the cryogenic liquid.

In another study, liquid nitrogen was cooled to about 70K by bubbling gaseous helium therethrough. The flow of gaseous helium was discontinued, and a flow of gaseous nitrogen was started. The temperature of the liquid nitrogen increased to about 77K.

In another study, the gas-space approach of FIG. 2 was used. A 5 psi pressure of helium was introduced into and maintained within the gas space above the liquid nitrogen. The temperature thereafter decreased as a function of time in the manner shown in FIG. 7. After about 30 minutes, the helium pressure was vented and released, and the temperature of the liquid nitrogen gradually increased back toward 77K.

Figure 8:
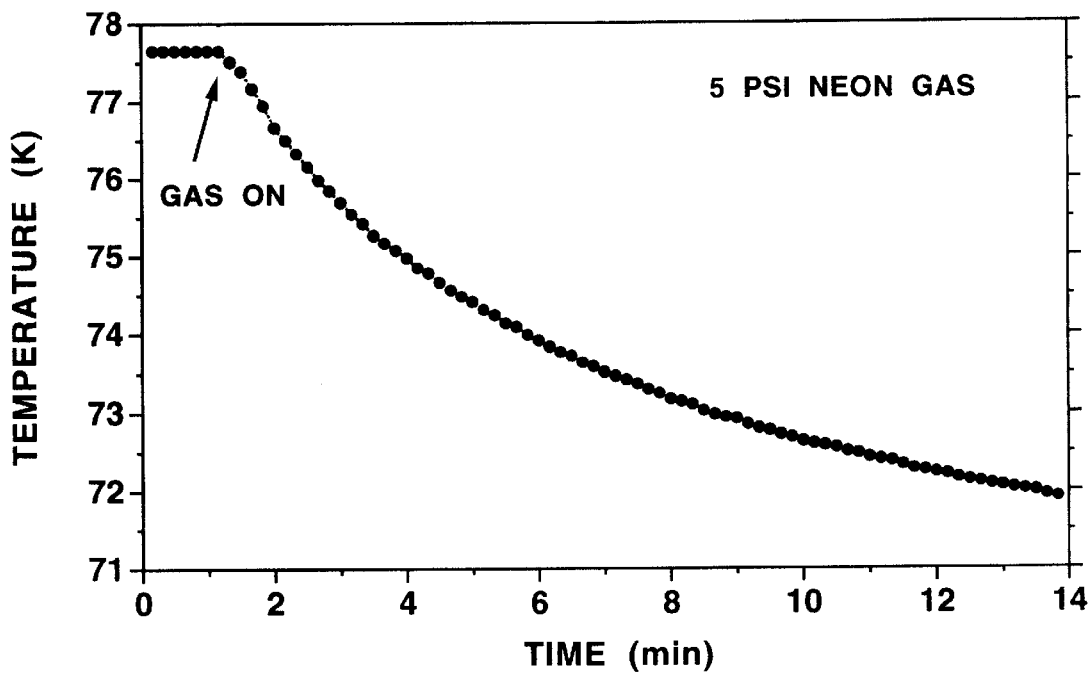
FIG. 8 is a graph of the temperature of liquid nitrogen as a function of time as neon gas is flowed into the liquid nitrogen.
Figure 9:
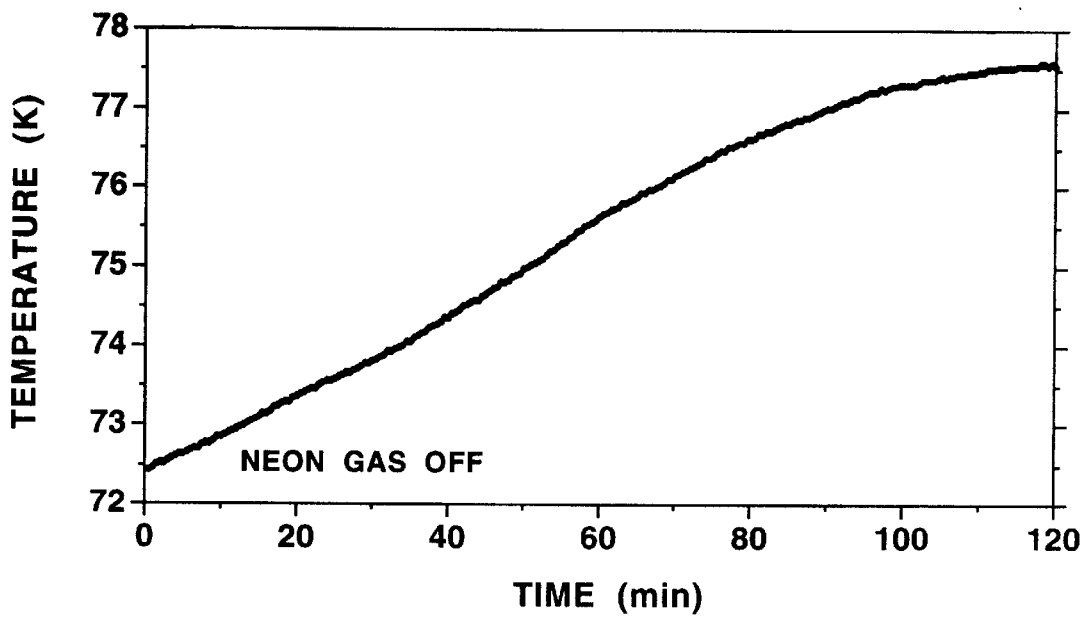
FIG. 9 is a graph of the temperature of liquid nitrogen when the flow of neon gas therethrough is discontinued.

Similarly operable results were obtained using neon as the gas, in the apparatus of FIG. 1. FIG. 8 illustrates the depression in temperature as a function of time after the initiation of bubbling neon gas through liquid nitrogen. When the bubbling of neon was discontinued, the temperature of the liquid nitrogen slowly increased back toward its ambient pressure value, as shown in FIG. 9.

The detailed thermodynamic principles underlying the present invention are not known with certainty. It is believed that the dissolution of the gas into the cryogenic liquid is endothermic, resulting in cooling of the cryogenic liquid. The operability of the invention is not, however, linked to any such possible explanation.

The present invention thus provides an approach to controlling the temperature of a cryogenic liquid to reduce its boiling temperature by up to about 10K, in the case of liquid nitrogen. The boiling temperature reduction is accomplished inexpensively and without adversely affecting the performance of a device in thermal contact with the cryogenic liquid. Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A cooling apparatus, comprising:

a container;

a cryogenic liquid within the container, wherein the cryogenic liquid is selected from the group consisting of liquid nitrogen, liquid argon, liquid neon, liquid helium, liquid hydrogen, liquid oxygen, liquid $CH_4$, liquid $C_2H_6$, and liquid $C_3H_8$; and a gas contacting the cryogenic liquid, the gas being of a different chemical composition than the cryogenic liquid and soluble in the cryogenic liquid.

2. The cooling apparatus of claim 1, wherein the container is a dewar.

3. The cooling apparatus of claim 1, wherein the cryogenic liquid is selected from the group consisting of liquid nitrogen, liquid argon, liquid neon, liquid helium, and liquid oxygen.

4. The cooling apparatus of claim 1, wherein the gas is selected from the group consisting of helium, neon, hydrogen, nitrogen, and argon.

5. The cooling apparatus of claim 1, wherein the container includes a cover thereon, and the gas is introduced above a top surface of the cryogenic liquid.

6. A cooling apparatus, comprising:
a container;
a cryogenic liquid within the container; and
a gas contacting the cryogenic liquid, the gas being of a different chemical composition than the cryogenic liquid and soluble in the cryogenic liquid, and
a source of the gas located below a top surface of the cryogenic liquid.

7. The cooling apparatus of claim 1, wherein the cooling apparatus further includes an electronic device in thermal contact with the cryogenic liquid.

8. The cooling apparatus of claim 7, wherein the electronic device is selected from the group consisting of a magnetic field sensor, a superconducting quantum interference device, a radiation sensor, and a computer circuit.

9. The cooling apparatus of claim 1, further including a source of a gaseous form of the cryogenic liquid located below a top surface of the cryogenic liquid.

10. The cooling apparatus of claim 1, further including means for circulating the cryogenic liquid through the container.

11. The cooling apparatus of claim 1, further including means for adding the gas produced when the cryogenic liquid boils, to the cryogenic liquid.

12. The cooling apparatus of claim 1, wherein the gas dissolves endothermically in the cryogenic liquid.

13. A cooling apparatus, comprising:
a dewar;
a quantity of liquid nitrogen within the dewar;
a gas contacting the liquid nitrogen, the gas being selected from the group consisting of helium, neon, hydrogen, and argon;
a source of the gas; and
an electronic device in thermal contact with the liquid nitrogen.

14. The cooling apparatus of claim 13, wherein the gas is helium.

15. The cooling apparatus of claim 13, wherein the container includes a cover thereon, and the source of the gas communicates with a space between the liquid nitrogen and the cover.

16. The cooling apparatus of claim 13, wherein the cooling apparatus further includes
a source of the gas located below a top surface of the liquid nitrogen.

17. The cooling apparatus of claim 13, wherein the electronic device is selected from the group consisting of a magnetic field sensor and a superconducting quantum interference device.

18. A cooling apparatus, comprising:
a dewar;
a quantity of liquid nitrogen within the dewar;
a source of helium gas;
helium gas contacting the liquid nitrogen; and
a superconducting quantum interference device in thermal contact with the liquid nitrogen.

19. The cooling apparatus of claim 18, further including means for adding nitrogen gas to the liquid nitrogen.

20. A method for cooling an electronic device, comprising the steps of:
providing a reservoir of liquid nitrogen;
placing an electronic device in, thermal contact with the reservoir of liquid nitrogen; and
dissolving helium gas into the liquid nitrogen, thereby cooling the liquid nitrogen below its normal boiling point.

* * * * *